United States Patent
Higashi et al.

(10) Patent No.: US 10,495,702 B2
(45) Date of Patent: Dec. 3, 2019

(54) SENSOR

(71) Applicant: Kabushiki Kaisha Toshiba, Tokyo (JP)

(72) Inventors: Yoshihiro Higashi, Ishikawa (JP); Michiko Hara, Kanagawa (JP); Tomohiko Nagata, Kanagawa (JP); Shiori Kaji, Kanagawa (JP); Yoshihiko Fuji, Kanagawa (JP); Akiko Yuzawa, Kanagawa (JP); Kenji Otsu, Kanagawa (JP); Kazuaki Okamoto, Kanagawa (JP); Shotaro Baba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 15/705,579

(22) Filed: Sep. 15, 2017

(65) Prior Publication Data
US 2018/0231621 A1 Aug. 16, 2018

(30) Foreign Application Priority Data

Feb. 15, 2017 (JP) .................................. 2017-026023

(51) Int. Cl.
*G01R 31/02* (2006.01)
*G01R 33/09* (2006.01)
(52) U.S. Cl.
CPC ................. *G01R 33/093* (2013.01)
(58) Field of Classification Search
USPC ............................ 324/249, 260; 73/576, 668
See application file for complete search history.

(56) References Cited

U.S. PATENT DOCUMENTS

| 5,602,527 A * | 2/1997 | Suenaga ............ G08B 13/2408 148/103 |
| 2002/0104381 A1* | 8/2002 | Debesis ................... G01L 1/24 73/800 |

(Continued)

FOREIGN PATENT DOCUMENTS

| JP | 2005-090971 | 7/2005 |
| JP | 2011-102730 A | 5/2011 |

(Continued)

OTHER PUBLICATIONS

A. Jander, et al "Chopping techniques for low-frequency nanotesia spin-dependent tunneling field sensors" Journal of Applied Physics vol. 93 No. 10 8382 (2003).

*Primary Examiner* — Vincent Q Nguyen
(74) *Attorney, Agent, or Firm* — Finnegan, Henderson, Farabow, Garrett & Dunner, L.L.P.

(57) ABSTRACT

According to one embodiment, a sensor includes a first film, a first sensor portion, a driving portion, and a processor. The first sensor portion is provided at the first film. The first sensor portion includes a first magnetic layer, a second magnetic layer, and a first intermediate layer. The second magnetic layer is provided between the first film and the first magnetic layer. The first intermediate layer is provided between the first magnetic layer and the second magnetic layer. The driving portion causes the first film to deform at a first frequency. The processor outputs a third signal based on a first signal and a second signal. The first signal relates to the first frequency. The second signal is output from the first sensor portion.

17 Claims, 8 Drawing Sheets

(56) References Cited

U.S. PATENT DOCUMENTS

| | | | |
|---|---|---|---|
| 2012/0206134 A1 | 8/2012 | Fischer et al. | |
| 2012/0245477 A1 | 9/2012 | Giddings et al. | |
| 2013/0255393 A1* | 10/2013 | Fukuzawa | G01L 1/12 73/779 |
| 2013/0289913 A1 | 10/2013 | Jahns et al. | |
| 2014/0369530 A1 | 12/2014 | Fuji et al. | |
| 2015/0082919 A1 | 3/2015 | Higashi et al. | |

FOREIGN PATENT DOCUMENTS

| | | |
|---|---|---|
| JP | 2012-204479 | 10/2012 |
| JP | 2014-508287 | 4/2014 |
| JP | 2014-240824 | 12/2014 |
| JP | 2015-59930 A | 3/2015 |
| WO | WO2004-070408 | 8/2004 |

* cited by examiner

SENSOR

CROSS-REFERENCE TO RELATED APPLICATIONS

This application is based upon and claims the benefit of priority from Japanese Patent Application No. 2017-026023, filed on Feb. 15, 2017; the entire contents of which are incorporated herein by reference.

FIELD

Embodiments described herein relate generally to a sensor.

BACKGROUND

There is a sensor such as a magnetic field sensor, etc., that converts a magnetic field applied from the outside into an electrical signal. It is desirable to increase the sensing precision of the sensor.

DETAILED DESCRIPTION

Figure 1A:
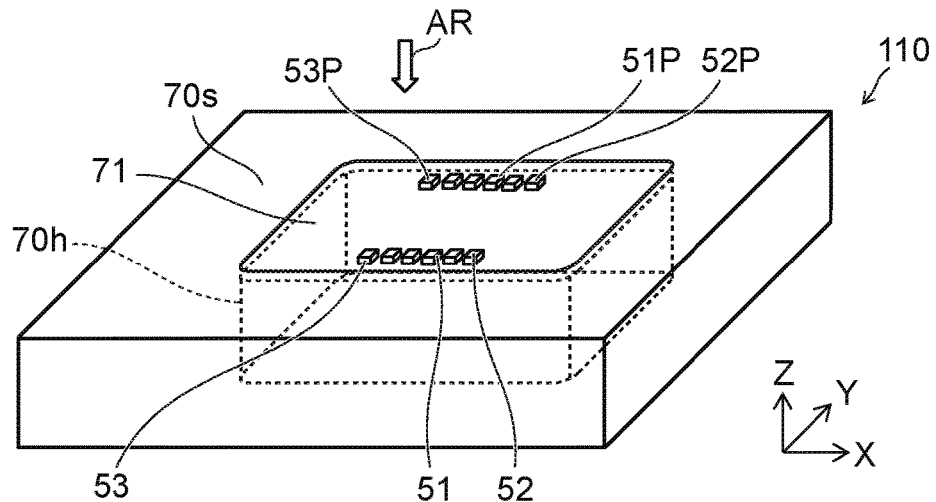
FIG. 1A to FIG. 1C are schematic views illustrating a sensor according to a first embodiment.

According to one embodiment, a sensor includes a first film, a first sensor portion, a driving portion, and a processor. The first sensor portion is provided at the first film. The first sensor portion includes a first magnetic layer, a second magnetic layer, and a first intermediate layer. The second magnetic layer is provided between the first film and the first magnetic layer. The first intermediate layer is provided between the first magnetic layer and the second magnetic layer. The driving portion is configured to cause the first film to deform at a first frequency. The processor is configured to output a third signal based on a first signal and a second signal. The first signal relates to the first frequency. The second signal is output from the first sensor portion.

According to one embodiment, a sensor includes a piezoelectric body layer, a first sensor portion, and a processor. The first sensor portion is provided at the piezoelectric body layer. The first sensor portion includes a first magnetic layer, a second magnetic layer, and a first intermediate layer. The second magnetic layer is provided between the piezoelectric body layer and the first magnetic layer. The first intermediate layer is provided between the first magnetic layer and the second magnetic layer. The processor is configured to apply a voltage of a first frequency to the piezoelectric body layer and output a third signal. The third signal is based on a first signal and a second signal. The first signal relates to the first frequency. The second signal is output from the first sensor portion.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
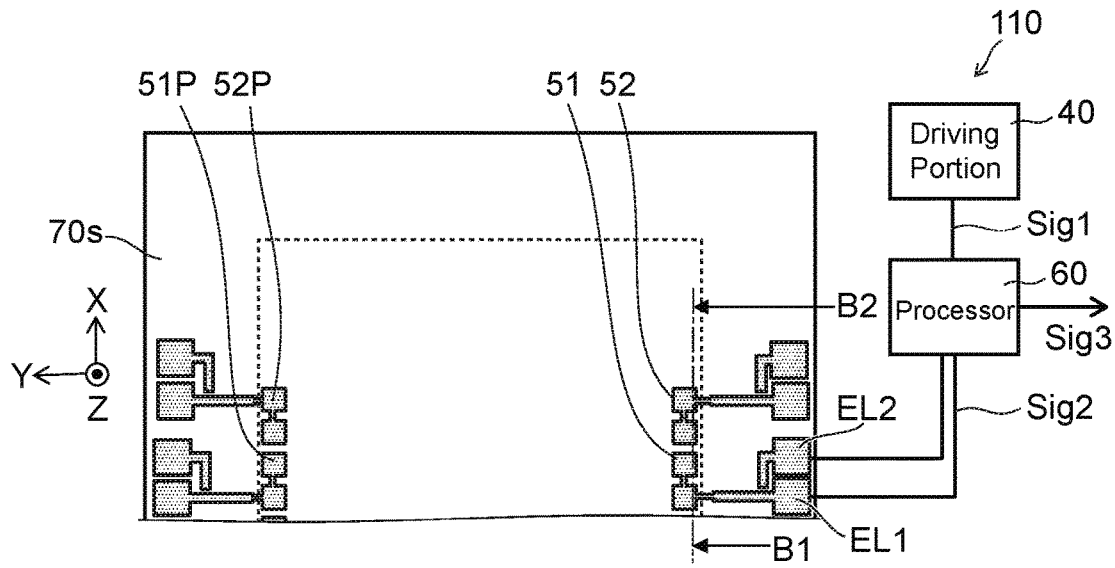
Figure 1C:
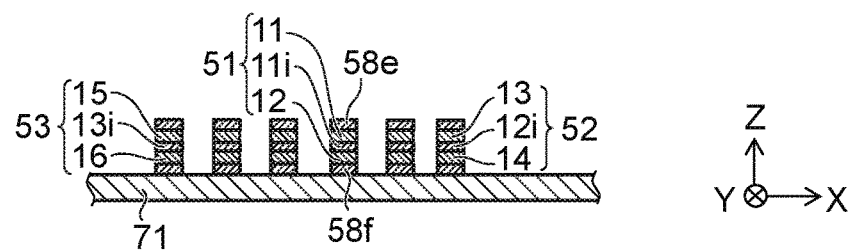

FIG. 1A to FIG. 1C are schematic views illustrating a sensor according to a first embodiment.

FIG. 1A is a perspective view. FIG. 1B is a plan view showing a portion of the sensor when viewed along arrow AR of FIG. 1A. FIG. 1C is a line B1-B2 cross-sectional view of FIG. 1B.

The sensor 110 according to the embodiment includes a first film 71, a first sensor portion 51, a driving portion 40, and a processor 60. The sensor 110 is, for example, a magnetic field sensor.

The first film 71 is deformable. For example, the first film 71 is supported by a support portion 70s. For example, a recess 70h is formed in a portion of the substrate used to form the first film 71 and the support portion 70s. The thin portion of the substrate is used to form the first film 71. The thick portion of the substrate is used to form the support portion 70s. In the example, the support portion 70s is connected to the outer edge of the first film 71. The planar configuration of the first film 71 is, for example, substantially a quadrilateral (including a rectangle, etc.), a circle (including a flattened circle), etc. The recited above deformable film may have a free end.

The first film 71 includes, for example, at least one selected from the group consisting of silicon, silicon nitride, and aluminum oxide.

The first sensor portion 51 is provided at the first film 71. For example, the first sensor portion 51 is provided on the surface of a portion of the first film 71. The front and back (the top and bottom) of the surface are arbitrary.

As shown in FIG. 1C, the first sensor portion 51 includes a first magnetic layer 11, a second magnetic layer 12, and a first intermediate layer 11i. The second magnetic layer 12 is provided between the first film 71 and the first magnetic layer 11. The first intermediate layer 11i is provided between the first magnetic layer 11 and the second magnetic layer 12.

In the first embodiment, a direction (a first direction) connecting the first film 71 and the first sensor portion 51 is taken as a Z-axis direction. For example, the first sensor portion 51 is provided at a portion of the first film 71. In such a case, the shortest direction connecting the first sensor portion 51 and the portion of the first film 71 corresponds to the first direction.

One axis perpendicular to the Z-axis direction is taken as an X-axis direction. A direction perpendicular to the Z-axis direction and the X-axis direction is taken as a Y-axis direction. In the example, the direction from the second magnetic layer 12 toward the first magnetic layer 11 corresponds to the Z-axis direction.

Multiple sensor portions (e.g., a second sensor portion 52, a third sensor portion 53, a sensor portion 51P, a sensor portion 52P, a sensor portion 53P, etc.) are provided in the example. The surface area in the X-Y plane of each of the multiple sensor portions is less than the surface area in the X-Y plane of the first film 71. At least a portion of the second sensor portion 52 overlaps at least a portion of the first sensor portion 51 along the X-axis direction. The first sensor portion 51 is provided between the second sensor portion 52 and the third sensor portion 53. At least a portion of the sensor portion 51P overlaps at least a portion of the first sensor portion 51 along the Y-axis direction. At least a portion of the sensor portion 52P overlaps at least a portion of the second sensor portion 52 along the Y-axis direction. At least a portion of the sensor portion 53P overlaps at least a portion of the third sensor portion 53 along the Y-axis direction.

The second sensor portion 52 includes a third magnetic layer 13, a fourth magnetic layer 14; and a second intermediate layer 12i. The fourth magnetic layer 14 is provided between the first film 71 and the third magnetic layer 13. The second intermediate layer 12i is provided between the third magnetic layer 13 and the fourth magnetic layer 14.

The third sensor portion 53 includes a fifth magnetic layer 15, a sixth magnetic layer 16, and a third intermediate layer 13i. The sixth magnetic layer 16 is provided between the first film 71 and the fifth magnetic layer 15. The third intermediate layer 13i is provided between the fifth magnetic layer 15 and the sixth magnetic layer 16.

The configurations of the sensor portions 51P to 53P are similar to those of the first to third sensor portions 51 to 53.

As shown in FIG. 1C, the magnetic layers recited above are provided between a first sensor conductive layer 58e and the first film 71. A second sensor conductive layer 58f is provided between the first film 71 and the magnetic layers recited above.

The first sensor conductive layer 58e that is electrically connected to the first sensor portion 51 is electrically connected to a first sensor electrode EL1. The second sensor conductive layer 58f that is electrically connected to the first sensor portion 51 is electrically connected to a second sensor electrode EL2.

The magnetization of at least one of the first magnetic layer 11 or the second magnetic layer 12 changes according to a magnetic field applied to the first sensor portion 51. The angle between the magnetization of the first magnetic layer 11 and the magnetization of the second magnetic layer 12 changes according to the magnetic field applied to the first sensor portion 51. The electrical resistance between the first magnetic layer 11 and the second magnetic layer 12 (the electrical resistance of the first sensor portion 51) changes due to the change of this angle. For example, the magnetic field that is applied to the first sensor portion 51 can be sensed by sensing the change of the electrical resistance between the first sensor electrode EL1 and the second sensor electrode EL2.

The magnetization of at least one of the first magnetic layer 11 or the second magnetic layer 12 changes according to the deformation of the first film 71. The angle between the magnetization of the first magnetic layer 11 and the magnetization of the second magnetic layer 12 changes according to the deformation of the first film 71. The electrical resistance between the first magnetic layer 11 and the second magnetic layer 12 (the electrical resistance of the first sensor portion 51) changes due to the change of this angle.

In the embodiment, the state of being electrically connected includes not only the state in which multiple conductors are in direct contact, but also the case where the multiple conductors are connected via another conductor. The state of being electrically connected includes the case where multiple conductors are connected via an element having a function such as switching, amplification, etc. For example, at least one of a switch element or an amplifier element may be inserted into at least one of the current path between the first sensor electrode EL1 and the first magnetic layer 11 or the current path between the second sensor electrode EL2 and the second magnetic layer 12.

For example, the first magnetic layer 11 is a free magnetic layer; and the second magnetic layer 12 is a magnetization reference layer. For example, the first magnetic layer 11 may be a magnetization reference layer; and the second magnetic layer 12 may be a free magnetic layer. Both the first magnetic layer 11 and the second magnetic layer 12 may be free magnetic layers. The description relating to the first sensor portion 51 recited above is applicable also to the other sensor portions (the second sensor portion 52, the third sensor portion 53, the sensor portion 51P, the sensor portion 52P, the sensor portion 53P, etc.).

The driving portion 40 causes the first film 71 to deform at a first frequency. For example, the driving portion 40 causes the first film 71 to vibrate at the first frequency by applying stress vibrating at the first frequency to the first film 71. Strain that changes at the first frequency is generated in the first film 71. As described below, the driving portion 40 is, for example, a speaker or an actuator.

The processor 60 is electrically connected to the driving portion 40. In the example, the processor 60 includes a control circuit controlling the operation of the driving portion 40. For example, the processor 60 supplies a first signal Slg1 relating to the first frequency to the driving portion 40. The first signal Sig1 includes information of the first frequency. For example, the first signal Sig1 includes a component vibrating at the first frequency. The driving portion 40 causes the first film 71 to deform at the first frequency based on the first signal Sig1.

The processor 60 is electrically connected to the sensor portions (the first sensor portion 51, etc.). For example, the first sensor portion 51 and the second sensor portion 52 are connected in parallel. The first sensor portion 51 and the second sensor portion may be connected in series. The first sensor portion 51 may include multiple sensors. The multiple sensors included in the first sensor portion 51 may connected in series or in parallel. The processor 60 is electrically connected to the first sensor electrode EL1 and the second sensor electrode EL2. The processor 60 acquires a second signal Sig2 output from the sensor portions (the first sensor portion 51, etc.).

The second signal Sig2 includes information of the electrical resistances of the sensor portions (the first sensor portion 51, etc.). The second signal Sig2 changes according to the deformation of the first film 71 and the magnetic field to be sensed that is applied to each of the sensor portions (the first sensor portion 51, etc.). The magnetic field to be sensed vibrates at a second frequency that is different from the first frequency. In such a case, the second signal Sig2 can be considered to be a signal in which a signal vibrating at the second frequency is modulated by the deformation (the vibration) of the first film 71.

The processor 60 outputs a third signal Sig3 based on the first signal Sig1 and the second signal Sig2. For example, the processor 60 outputs the third signal Sig3 by demodulating the output of the sensor portions modulated by the vibration of the first film 71. The third signal Sig3 includes a component of the second frequency. Thereby, the magnetic field applied from the outside to the sensor portions can be sensed.

For the sensor portions using the magnetic layers, the sensing precision may be low in some ranges of frequency of the magnetic field to be sensed. Conversely, in the embodiment, the first sensor portion 51 is provided at the first film 71 deforming at the first frequency. Thereby, the frequency of the electrical resistance sensed by the first sensor portion 51 changes from the second frequency. Thereby, for example, the first sensor portion 51 can perform the sensing in a range of frequencies having high sensing precision.

For example, the second frequency is lower than the first frequency. The first frequency is, for example, not less than 1 kilohertz (kHz) and not more than 100 kHz. The second frequency is, for example, not less than 1 hertz (Hz) and not more than 1000 Hz. The sensing precision may decrease due to 1/f noise of the sensor portion in the case where the sensing object has a low frequency such as the second frequency. Conversely, the embodiment performs high frequency superimposition using the first film 71 deforming at the high frequency. Thereby, the effects of the 1/f noise can be suppressed; and the sensing precision can be increased.

FIG. 2 and FIG. 3A to FIG. 3C are schematic views illustrating operations of the sensor according to the first embodiment.

Figure 2:
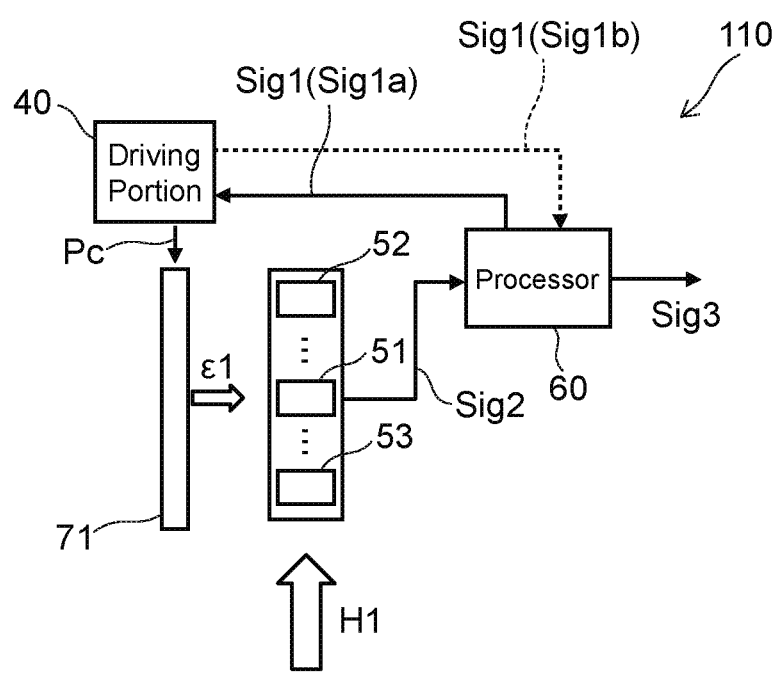
FIG. 2 is a schematic view illustrating an operation of the sensor according to the first embodiment.

As shown in FIG. 2, the processor 60 supplies the first signal Sig1 to the driving portion 40. In such a case, the first signal Sig1 is, for example, a signal (a first signal Sig1a) controlling the operation of the driving portion 40. However, the driving portion 40 may not be controlled by the processor 60. In such a case, the processor 60 may acquire a signal (a first signal Sig1b) relating to the first frequency from the driving portion 40 or another circuit controlling the driving portion 40.

Figure 3A:
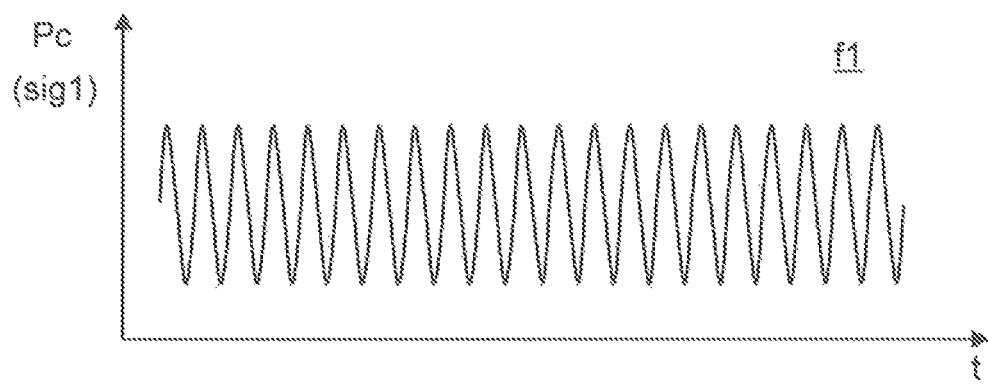
FIG. 3A to FIG. 3C are schematic views illustrating operations of the sensor according to the first embodiment.

The driving portion 40 applies, to the first film 71, stress Pc changing at the first frequency. Thereby, strain ε1 is generated in the first film 71. FIG. 3A illustrates the temporal change of the stress Pc (or the strain ε1). The horizontal axis illustrates a time t; and the vertical axis illustrates the stress Pc. As shown in FIG. 3A, the stress Pc vibrates at a first frequency f1. The first signal Sig1 may be an analog signal vibrating at the first frequency f1 as in FIG. 3A, or may be a digital signal including information of the first frequency f1.

As shown in FIG. 2, a magnetic field H1 which is the object of the sensing is applied to the sensor portions. For example, the magnetic field H1 vibrates at a second frequency f2 that is lower than the first frequency f1. A change of the electrical resistance occurs in the sensor portions (the first to third sensor portions 51 to 53, etc.) due to the magnetic field H1 and the strain ε1. The sensor portions (the first to third sensor portions 51 to 53, etc.) are electrically connected to the processor 60. In this example, the first sensor portion 51, the second sensor portion 52 and the third sensor portion 53 are connected in parallel. For example, two or more of these sensor portions may be connected in series. For example, the first sensor portion 51 and the second sensor portion 52 may be connected in series. The change of the electrical resistance is sensed by the processor 60 as the second signal Sig2.

Figure 3B:
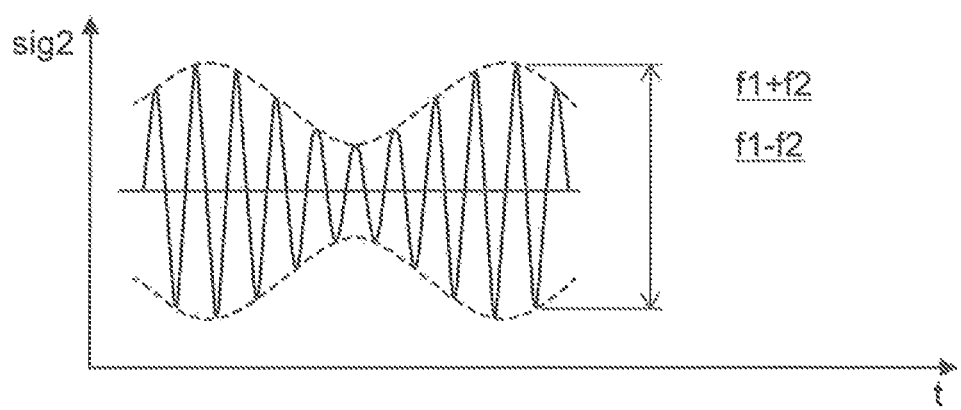

FIG. 3B illustrates the temporal change of the second signal Sig2. The horizontal axis illustrates the time t; and the vertical axis illustrates the second signal Sig2. For example, the temporal change of the second signal Sig2 is illustrated by the product of the cosine wave of the first frequency f1 and the cosine wave of the second frequency f2. Thereby, the second signal Sig2 includes, for example, a component vibrating at the frequency (f1−f2) of the difference between the first frequency f1 and the second frequency f2 and a component vibrating at the frequency (f1+f2) of the sum of the first frequency f1 and the second frequency f2.

Figure 3C:
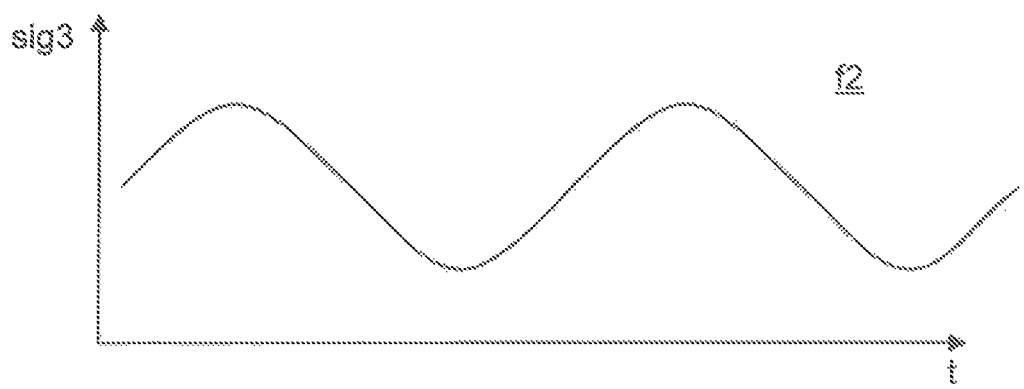

The processor 60 outputs the third signal Sig3 based on the first signal Sig1 and the second signal Sig2. For example, the processor 60 calculates the signal of the second signal Sig2 further multiplied by the cosine wave vibrating at the first frequency f1. This signal includes a component vibrating at the second frequency f2. The third signal Sig3 that vibrates at the second frequency f2 is output from this signal by using a low-pass filter, etc. FIG. 3C illustrates the temporal change of the third signal Sig3. The horizontal axis illustrates the time t; and the vertical axis illustrates the third signal Sig3. Thus, the magnetic field H1 that changes at the second frequency can be sensed.

Figure 4:
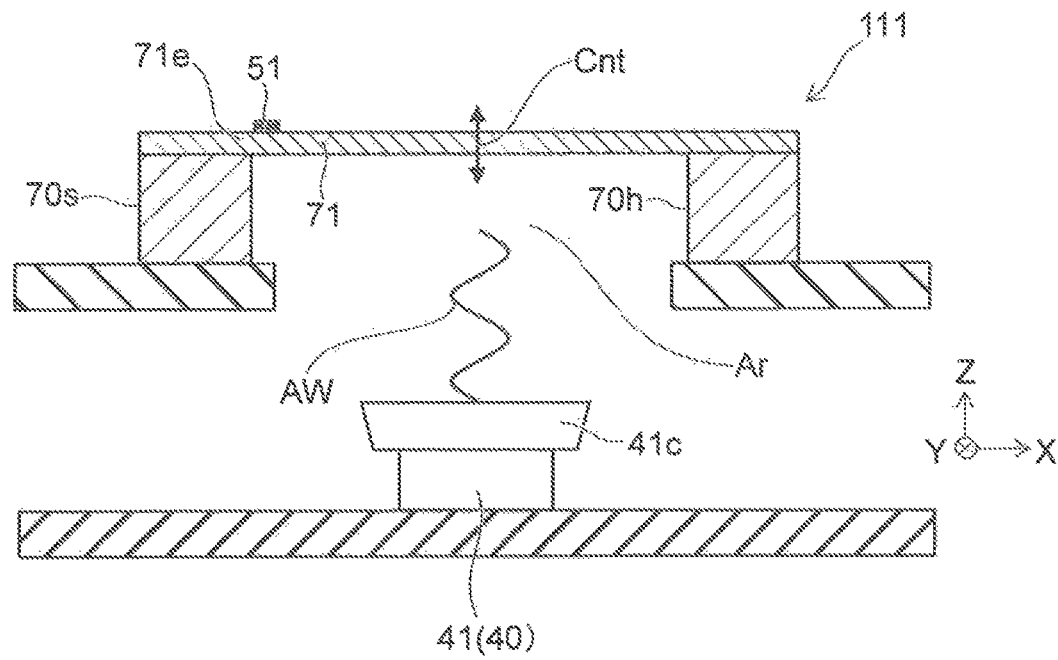
FIG. 4 is a schematic cross-sectional view illustrating a sensor according to the first embodiment.

FIG. 4 is a schematic cross-sectional view illustrating a sensor according to the first embodiment.

The sensor 111 shown in FIG. 4 includes a driving portion 41 as the driving portion 40 described above. The driving portion 41 emits a pressure wave AW. The pressure wave AW includes, for example, at least one of a sound wave or an ultrasonic wave. The driving portion 41 is, for example, an acoustic device (a speaker) emitting a sound wave. Otherwise, a description similar to that of the sensor 110 is applicable to the sensor 111.

In the example, the first film 71 is provided between the driving portion 41 and the sensor portions (the first sensor portion 51, etc.). For example, a diaphragm (a cone) 41c of the driving portion 41 is arranged in the Z-axis direction with a center Cnt of the first film 71 in the X-Y plane. The multiple sensor portions are provided along an outer edge 71e of the first film 71.

Air Ar exists between the driving portion 41 and the first film 71. The air Ar is a medium transferring the vibration (the pressure wave) emitted by the driving portion 41 to the first film 71. In the embodiment, the medium of the pressure wave is not limited to air, and may be another gas, liquid, etc.

The driving portion 41 (the diaphragm 41c) vibrates at the first frequency. Thereby, the driving portion 41 emits the pressure wave AW of the first frequency toward, for example, the center Cnt of the first film 71.

The first film 71 receives the pressure wave AW. Stress is applied to the first film 71 by the pressure wave AW; and the first film 71 vibrates at the first frequency. The deformation of the first film 71 includes a Z-axis direction component. For example, the position of the first film 71 (e.g., the position of the center Cnt) is displaced at the first frequency in the Z-axis direction.

Figure 5:
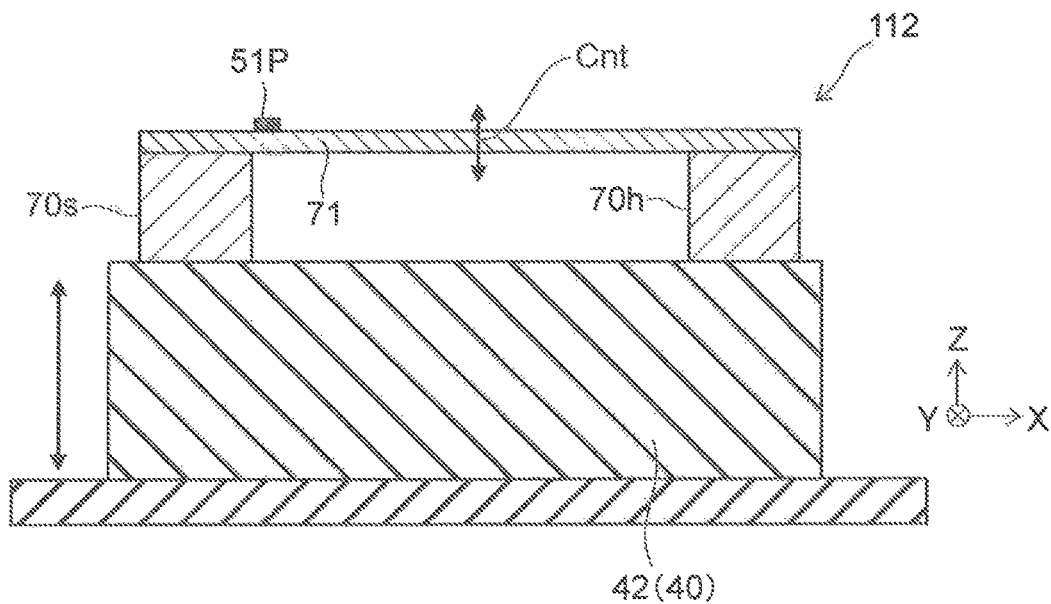
FIG. 5 is a schematic cross-sectional view illustrating a sensor according to the first embodiment.

FIG. 5 is a schematic cross-sectional view illustrating a sensor according to the first embodiment.

The sensor 112 shown in FIG. 5 includes a driving portion 42 as the driving portion 40 described above. The driving portion 42 is, for example, an actuator. The actuator includes, for example, a solenoid, a motor, a piezoelectric body, etc. Otherwise, a description that is similar to that of the sensor 110 is applicable to the sensor 112.

In the example, the first film 71 is provided between the driving portion 42 and the sensor portions (the first sensor portion 51, etc.). For example, the support portion 70s is fixed to a portion of the driving portion 42. The support portion 70s may be directly fixed to the driving portion 42. The support portion 70s may be fixed indirectly to the driving portion 42 with another member interposed. The relative position of the support portion 70s with respect to at least a portion of the driving portion 40 is, for example, constant.

As shown in FIG. 5, the vibration of the driving portion 42 includes a Z-axis direction component. For example, the driving portion 42 vibrates at the first frequency in, for example, the Z-axis direction. Thereby, the deformation of the first film 71 includes the Z-axis direction component. For example, the support portion 70s and the first film 71 vibrate at the first frequency in the Z-axis direction. An inertial force that includes a Z-axis direction component acts on the first film 71. For example, an inertial force (stress) that vibrates at the first frequency acts on the first film 71.

Second Embodiment

Figure 6A:
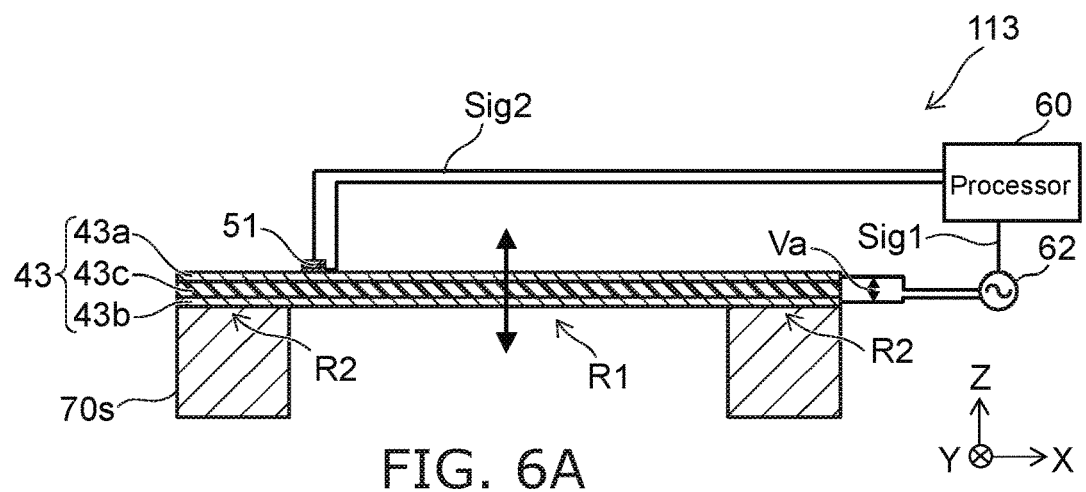
FIG. 6A and FIG. 6B are schematic cross-sectional views illustrating a sensor according to a second embodiment.
Figure 6B:
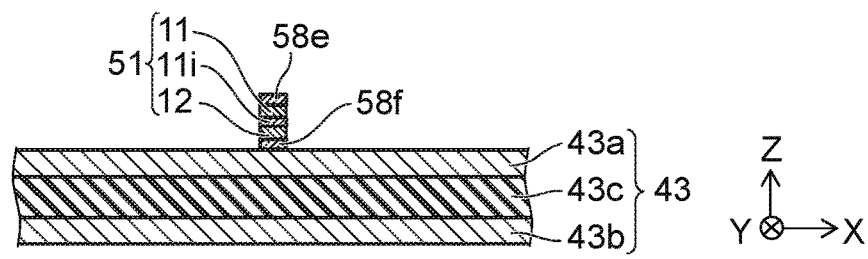

FIG. 6A and FIG. 6B are schematic cross-sectional views illustrating a sensor according to a second embodiment.

FIG. 6B illustrates an enlarged portion of FIG. 6A.

The sensor 113 according to the second embodiment includes a first element portion 43, the sensor portions (the first sensor portion 51, etc.), and the processor 60.

The first sensor portion 51 is provided at the first element portion 43 (a first piezoelectric layer 43c). For example, the first sensor portion 51 is provided on the surface of a portion of the first element portion 43. The front and back (the top and bottom) of the surface are arbitrary.

The first element portion 43 includes a first element conductive layer 43a, a second element conductive layer 43b, and the first piezoelectric layer (the piezoelectric body layer) 43c. The second magnetic layer 12 is provided between the first piezoelectric layer 43c and the first magnetic layer 11. The first intermediate layer 11i is provided between the first magnetic layer 11 and the second magnetic layer 12. The first element conductive layer 43a is provided between the second element conductive layer 43b and the first sensor portion 51. The first piezoelectric layer 43c is provided between the first element conductive layer 43a and the second element conductive layer 43b.

The first piezoelectric layer 43c includes, for example, at least one of PZT (lead zirconate titanate), AlN, ZnO, KNN ((K,Na)NbO$_3$), BaTiO$_3$, or BiFeO$_3$. The first piezoelectric layer 43c may include a polymer.

In the second embodiment, the direction (the first direction) connecting the first piezoelectric layer 43c and the first sensor portion 51 is taken as the Z-axis direction. For example, the shortest direction connecting the first element portion 43 and the first sensor portion 51 corresponds to the first direction.

For example, the first element portion 43 has a film configuration spreading along the X-Y plane. The first element portion 43 is supported by the support portion 70s. The first element portion 43 includes a first element region R1 not overlapping the support portion 70s in the Z-axis direction, and includes a second element region R2 overlapping the support portion 70s in the Z-axis direction. For example, the second element region R2 is fixed to the support portion 70s. The outer edge of the first element region R1 is connected to the second element region R2. Similarly to the first film 71 described in reference to the first embodiment, the planar configuration of the first element region R1 is substantially a quadrilateral, a circle, etc.

Similarly to the first sensor portion 51 provided at the first film 71 in the first embodiment, the first sensor portion 51 shown in FIG. 6A and FIG. 6B is provided at a portion of the first element region R1. Similarly to the multiple sensor portions provided at the first film 71 in the first embodiment, multiple sensor portions may be provided at a portion of the first element region R1. An insulating layer is provided as appropriate between the first element region R1 and the sensor portions.

The first element conductive layer 43a and the second element conductive layer 43b each are electrically connected to a power supply circuit 62. For example, a voltage is applied to the first piezoelectric layer 43c when the power supply circuit 62 applies a voltage Va between the first element conductive layer 43a and the second element conductive layer 43b. Strain is generated in the first piezoelectric layer 43c according to the voltage. The first element portion 43 (the first piezoelectric layer 43c) deforms due to the strain.

The processor 60 is electrically connected to the power supply circuit 62. For example, the processor 60 supplies, to the power supply circuit 62, the first signal Sig1 relating to the first frequency. The power supply circuit 62 supplies the voltage Va vibrating at the first frequency based on the first signal Sig1. Thereby, the first piezoelectric layer 43c (the first element region R1) deforms at the first frequency.

The magnetization of at least one of the first magnetic layer 11 or the second magnetic layer 12 changes according to the deformation (the strain) of the first piezoelectric layer 43c. The angle between the magnetization of the first magnetic layer 11 and the magnetization of the second magnetic layer 12 changes according to the deformation of the first piezoelectric layer 43c. The electrical resistance between the first magnetic layer 11 and the second magnetic layer 12 (the electrical resistance of the first sensor portion 51) changes due to the change of this angle.

Figure 7:
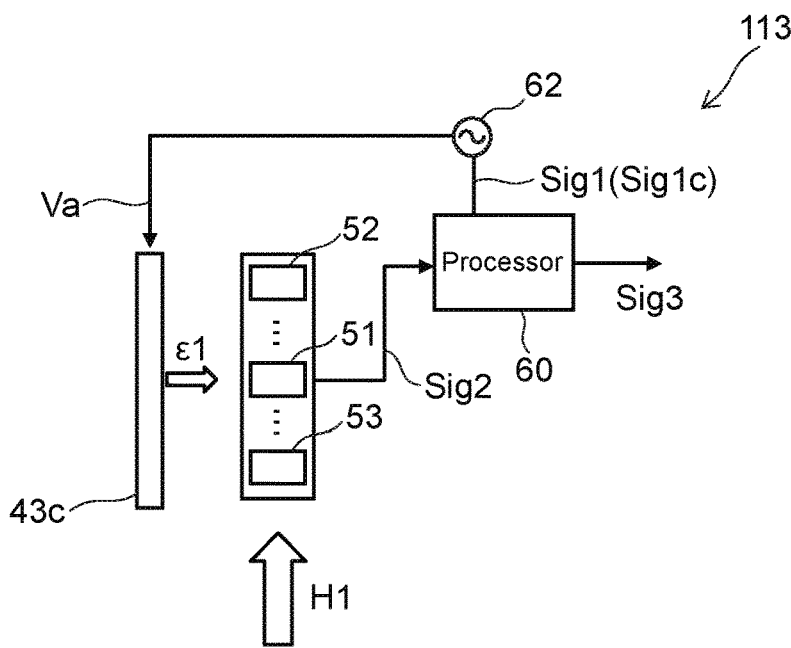
FIG. 7 is a schematic view illustrating the operations of the sensor according to the second embodiment.

FIG. 7 is a schematic view illustrating the operations of the sensor according to the second embodiment.

The processor 60 applies a voltage of the first frequency to the first piezoelectric layer 43c. For example, as shown in FIG. 7, the processor 60 supplies, to the power supply circuit 62, the first signal Sig1 relating to the first frequency. In the example, the first signal Sig1 is a signal (a first signal Sig1c) controlling the voltage Va vibrating at the first frequency.

In the embodiment, the power supply circuit 62 may be a portion of the processor 60. The first signal Sig1 may not be the signal (the first signal Sig1c) directly supplied to the power supply circuit 62. It is sufficient for the first signal Sig1 to include information of the first frequency.

The strain ε1 that changes at the first frequency is generated in the first piezoelectric layer 43c due to the voltage Va. As shown in FIG. 7, the magnetic field H1 is applied to the sensor portions. Changes of the electrical resistances of the sensor portions occur due to the magnetic field H1 and the strain ε1. The changes of the electrical resistances are sensed by the processor 60 as the second signal Sig2.

Similarly to the first embodiment, the processor 60 outputs the third signal based on the first signal and the second signal. For example, the processor 60 outputs the third signal Sig3 by demodulating the output of the sensor portions modulated by the vibration of the first piezoelectric layer 43c. The third signal Sig3 includes a component of the second frequency. Thereby, the magnetic field H1 that changes at the second frequency can be sensed. According to the embodiment, the sensing precision can be increased.

Examples of the sensor portions used in the embodiments will now be described. In the following description, the notation "material A/material B" indicates a state in which a layer of material B is provided on a layer of material A.

Figure 8:
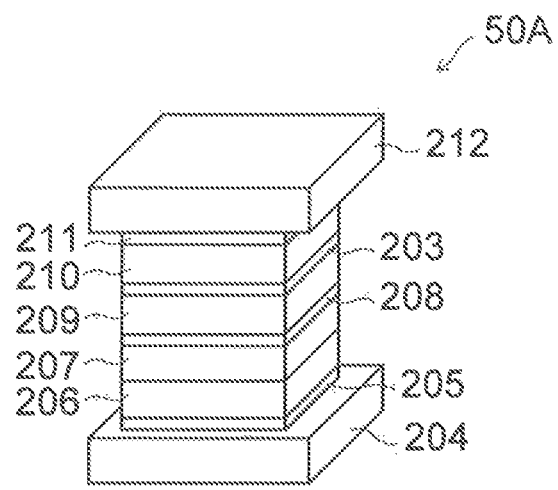
FIG. 8 is a schematic perspective view illustrating a portion of the sensor according to the embodiment.

FIG. 8 is a schematic perspective view illustrating a portion of the sensor according to the embodiment.

In the sensor portion 50A as shown in FIG. 8, a lower electrode 204, a foundation layer 205, a pinning layer 206, a second magnetization reference layer 207, a magnetic coupling layer 208, a first magnetization reference layer 209, an intermediate layer 203, a free magnetic layer 210, a capping layer 211, and an upper electrode 212 are arranged in this order. The sensor portion 50A is, for example, a bottom spin-valve type. The magnetization reference layer is, for example, a fixed magnetic layer.

The foundation layer 205 includes, for example, a stacked film of tantalum and ruthenium (Ta/Ru). The thickness (the length in the Z-axis direction) of the Ta layer is, for example, 3 nanometers (nm). The thickness of the Ru layer is, for example, 2 nm. The pinning layer 206 includes, for example, an IrMn-layer having a thickness of 7 nm. The second magnetization reference layer 207 includes, for example, a $Co_{75}Fe_{25}$ layer having a thickness of 2.5 nm. The magnetic coupling layer 208 includes, for example, a Ru layer having a thickness of 0.9 nm. The first magnetization reference layer 209 includes, for example, a $Co_{40}Fe_{40}B_{20}$ layer having a thickness of 3 nm. The intermediate layer 203 includes, for example, a MgO layer having a thickness of 1.6 nm. The free magnetic layer 210 includes, for example, a $Co_{40}Fe_{40}B_{20}$ having a thickness of 4 nm. The capping layer 211 includes, for example, Ta/Ru. The thickness of the Ta layer is, for example, 1 nm. The thickness of the Ru layer is, for example, 5 nm.

The lower electrode 204 and the upper electrode 212 include, for example, at least one of aluminum (Al), aluminum copper alloy (Al—Cu), copper (Cu), silver (Ag), or gold (Au). By using such a material having a relatively small electrical resistance as the lower electrode 204 and the upper electrode 212, the current can be caused to flow efficiently through the sensor portion 50A. The lower electrode 204 and the upper electrode 212 include nonmagnetic materials.

The lower electrode 204 and the upper electrode 212 may include, for example, a foundation layer (not illustrated) for the lower electrode 204 and the upper electrode 212, a capping layer (not illustrated) for the lower electrode 204 and the upper electrode 212, and a layer of at least one of Al, Al—Cu, Cu, Ag, or Au provided between the foundation layer and the capping layer. For example, the lower electrode 204 and the upper electrode 212 include tantalum (Ta)/copper (Cu)/tantalum (Ta), etc. For example, by using Ta as the foundation layer of the lower electrode 204 and the upper electrode 212, the adhesion between the substrate (e.g., a film) and the lower electrode 204 and between the substrate and the upper electrode 212 improves. Titanium (Ti), titanium nitride (TiN), etc., may be used as the foundation layer for the lower electrode 204 and the upper electrode 212.

By using Ta as the capping layer of the lower electrode 204 and the upper electrode 212, the oxidization of the copper (Cu), etc., under the capping layer is suppressed. Titanium (Ti), titanium nitride (TiN), etc., may be used as the capping layer for the lower electrode 204 and the upper electrode 212.

The foundation layer 205 includes, for example, a stacked structure including a buffer layer (not illustrated) and a seed layer (not illustrated). For example, the buffer layer relaxes the roughness of the surfaces of the lower electrode 204, the film, etc., and improves the crystallinity of the layers stacked on the buffer layer. For example, at least one selected from the group consisting of tantalum (Ta), titanium (Ti), vanadium (V), tungsten (W), zirconium (Zr), hafnium (Hf), and chrome (Cr) is used as the buffer layer. An alloy that includes at least one material selected from these materials may be used as the buffer layer.

It is favorable for the thickness of the buffer layer of the foundation layer 205 to be not less than 1 nm and not more than 10 nm. It is more favorable for the thickness of the buffer layer to be not less than 1 nm and not more than 5 nm. In the case where the thickness of the buffer layer is too thin, the buffering effect is lost. In the case where the thickness of the buffer layer is too thick, the thickness of the sensor portion 50A becomes excessively thick. The seed layer is formed on the buffer layer; and, for example, the seed layer has a buffering effect. In such a case, the buffer layer may be omitted. The buffer layer includes, for example, a Ta layer having a thickness of 3 nm.

The seed layer of the foundation layer 205 controls the crystal orientation of the layers stacked on the seed layer. The seed layer controls the crystal grain size of the layers stacked on the seed layer. As the seed layer, a metal having a fcc structure (face-centered cubic structure), a hcp structure (hexagonal close-packed structure), a bcc structure (body-centered cubic structure), or the like is used.

For example, the crystal orientation of the spin-valve film on the seed layer can be set to the fcc (111) orientation by using, as the seed layer of the foundation layer 205, ruthenium (Ru) having a hcp structure, NiFe having a fcc structure, or Cu having a fcc structure.

The seed layer includes, for example, a Cu layer having a thickness of 2 nm or a Ru layer having a thickness of 2 nm. To increase the crystal orientation of the layers formed on the seed layer, it is favorable for the thickness of the seed layer to be not less than 1 nm and not more than 5 nm. It is more favorable for the thickness of the seed layer to be not less than 1 nm and not more than 3 nm. Thereby, the function as a seed layer that improves the crystal orientation is realized sufficiently.

On the other hand, for example, the seed layer may be omitted in the case where it is unnecessary for the layers formed on the seed layer to have a crystal orientation (e.g., in the case where an amorphous free magnetic layer is formed, etc.). For example, a Cu layer having a thickness of 2 nm is used as the seed layer.

For example, the pinning layer 206 provides unidirectional anisotropy to the second magnetization reference layer 207 (the ferromagnetic layer) formed on the pinning layer 206 and fixes the magnetization of the second magnetization reference layer 207. The pinning layer 206 includes, for example, an antiferromagnetic layer. The pinning layer 206 includes, for example, at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. An alloy may be used in which an added element is further added to the at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The thickness of the pinning layer 206 is set appropriately. Thereby, for example, unidirectional anisotropy of sufficient strength is provided.

For example, heat treatment is performed while applying a magnetic field. Thereby, for example, the magnetization of the ferromagnetic layer contacting the pinning layer 206 is fixed. The magnetization of the ferromagnetic layer contacting the pinning layer 206 is fixed in the direction of the magnetic field applied in the heat treatment. For example, the heat treatment temperature (the annealing temperature) is not less than the magnetization pinning temperature of the antiferromagnetic material included in the pinning layer 206. In the case where an antiferromagnetic layer including Mn is used, there are cases where the MR ratio decreases due to the Mn diffusing into layers other than the pinning layer 206. It is desirable for the heat treatment temperature to be set to be not more than the temperature at which the diffusion of Mn occurs. The heat treatment temperature is, for example, not less than 200° C. and not more than 500° C. Favorably, the heat treatment temperature is, for example, not less than 250° C. and not more than 400° C.

In the case where PtMn or PdPtMn is used as the pinning layer 206, it is favorable for the thickness of the pinning layer 206 to be not less than 8 nm and not more than 20 nm. It is more favorable for the thickness of the pinning layer 206 to be not less than 10 nm and not more than 15 nm. In the case where IrMn is used as the pinning layer 206, unidirectional anisotropy can be provided using a thickness that is thinner than the case where PtMn is used as the pinning layer 206. In such a case, it is favorable for the thickness of the pinning layer 206 to be not less than 4 nm and not more than 18 nm. It is more favorable for the thickness of the pinning layer 206 to be not less than 5 nm and not more than 15 nm. The pinning layer 206 includes, for example, an $Ir_{22}Mn_{78}$ layer having a thickness of 7 nm.

A hard magnetic layer may be used as the pinning layer 206. For example, Co—Pt, Fe—Pt, Co—Pd, Fe—Pd, etc., may be used as the hard magnetic layer. For example, the magnetic anisotropy and the coercivity are relatively high for these materials. These materials are hard magnetic materials. An alloy in which an added element is further added to Co—Pt, Fe—Pt, Co—Pd, or Fe—Pd may be used as the pinning layer 206. For example, CoPt (the proportion of Co being not less than 50 at. % and not more than 85 at. %), $(Co_xPt_{100-x})_{100-y}Cr_y$ (x being not less than 50 at. % and not more than 85 at. %, and y being not less than 0 at. % and not more than 40 at. %), FePt (the proportion of Pt being not less than 40 at. % and not more than 60 at. %), etc., may be used.

The second magnetization reference layer 207 includes, for example, a $Co_xFe_{100-x}$ alloy (x being not less than 0 at. % and not more than 100 at. %) or a $Ni_xFe_{100-x}$ alloy (x being not less than 0 at. % and not more than 100 at. %). These materials may include a material to which a nonmagnetic element is added. For example, at least one selected from the group consisting of Co, Fe, and Ni is used as the second magnetization reference layer 207. An alloy that includes at least one material selected from these materials may be used as the second magnetization reference layer 207. Also, a $(Co_xFe_{100-x})_{100-y}B_y$ alloy (x being not less than 0 at. % and not more than 100 at. %, and y being not less than 0 at. % and not more than 30 at. %) may be used as the second magnetization reference layer 207. By using an amorphous alloy of $(Co_xFe_{100-x})_{100-y}B_y$ as the second magnetization reference layer 207, the fluctuation of the characteristics of the sensor portion 50A can be suppressed even in the case where the sizes of the sensor portions are small.

For example, it is favorable for the thickness of the second magnetization reference layer 207 to be not less than 1.5 nm and not more than 5 nm. Thereby, for example, the strength of the unidirectional anisotropic magnetic field due to the pinning layer 206 can be stronger. For example, the strength of the antiferromagnetic coupling magnetic field between the second magnetization reference layer 207 and the first magnetization reference layer 209 via the magnetic coupling layer formed on the second magnetization reference layer 207 can be stronger. For example, it is favorable for the magnetic thickness (the product of the saturation magnetization and the thickness) of the second magnetization reference layer 207 to be substantially equal to the magnetic thickness of the first magnetization reference layer 209.

The saturation magnetization of the thin film of $Co_{40}Fe_{40}B_{20}$ is about 1.9 T (teslas). For example, in the case where a $Co_{40}Fe_{40}B_{20}$ layer having a thickness of 3 nm is used as the first magnetization reference layer 209, the magnetic thickness of the first magnetization reference layer 209 is 1.9 T×3 nm, i.e., 5.7 Tnm. On the other hand, the saturation magnetization of $Co_{75}Fe_{25}$ is about 2.1 T. The thickness of the second magnetization reference layer 207 to obtain a magnetic thickness equal to that recited above is 5.7 Tnm/2.1 T, i.e., 2.7 nm. In such a case, it is favorable for a $Co_{75}Fe_{25}$ layer having a thickness of about 2.7 nm to be included in the second magnetization reference layer 207. For example, a $Co_{75}Fe_{25}$ layer having a thickness of 2.5 nm is used as the second magnetization reference layer 207.

In the sensor portion 50A, a synthetic pinned structure made of the second magnetization reference layer 207, the magnetic coupling layer 208, and the first magnetization reference layer 209 is used. A single pinned structure made of one magnetization reference layer may be used instead. In the case where the single pinned structure is used, for example, a $Co_{40}Fe_{40}B_{20}$ layer having a thickness of 3 nm is used as the magnetization reference layer. The same material as the material of the second magnetization reference layer 207 described above may be used as the ferromagnetic layer included in the magnetization reference layer having the single pinned structure.

The magnetic coupling layer 208 causes antiferromagnetic coupling to occur between the second magnetization reference layer 207 and the first magnetization reference layer 209. The magnetic coupling layer 208 has a synthetic pinned structure. For example, Ru is used as the material of the magnetic coupling layer 208. For example, it is favorable for the thickness of the magnetic coupling layer 208 to be not less than 0.8 nm and not more than 1 nm. A material other than Ru may be used as the magnetic coupling layer 208 if the material causes sufficient antiferromagnetic coupling to occur between the second magnetization reference layer 207 and the first magnetization reference layer 209. For example, the thickness of the magnetic coupling layer 208 is set to a thickness not less than 0.8 nm and not more than 1 nm corresponding to the second peak (2nd peak) of RKKY (Ruderman-Kittel-Kasuya-Yosida) coupling. Further, the thickness of the magnetic coupling layer 208 may be set to a thickness not less than 0.3 nm and not more than 0.6 nm corresponding to the first peak (1st peak) of RKKY coupling. For example, Ru having a thickness of 0.9 nm is used as the material of the magnetic coupling layer 208. Thereby, highly reliable coupling is obtained more stably.

The magnetic layer that is included in the first magnetization reference layer 209 contributes directly to the MR effect. For example, a Co—Fe—B alloy is used as the first magnetization reference layer 209. Specifically, a $(Co_xFe_{100-x})_{100-y}B_y$ alloy (x being not less than 0 at. % and not more than 100 at. %, and y being not less than 0 at. % and not more than 30 at. %) may be used as the first magnetization reference layer 209. For example, the fluctuation between the elements caused by crystal grains can be suppressed even in the case where the size of the sensor portion 50A is small by using a $(Co_xFe_{100-x})_{100-y}B_y$ amorphous alloy as the first magnetization reference layer 209.

The layer (e.g., a tunneling insulating layer (not illustrated)) that is formed on the first magnetization reference layer 209 may be planarized. The defect density of the tunneling insulating layer can be reduced by planarizing the tunneling insulating layer. Thereby, a higher MR ratio is obtained with a lower resistance per area. For example, in the case where MgO is used as the material of the tunneling insulating layer, the (100) orientation of the MgO layer that is formed on the tunneling insulating layer can be strengthened by using a $(Co_xFe_{100-x})_{100-y}B_y$ amorphous alloy as the first magnetization reference layer 209. A higher MR ratio is obtained by increasing the (100) orientation of the MgO layer. The $(Co_xFe_{100-x})_{100-y}B_y$ alloy crystallizes using the (100) plane of the MgO layer as a template when annealing. Therefore, good crystal conformation between the MgO and the $(Co_xFe_{100-x})_{100-y}B_y$ alloy is obtained. A higher MR ratio is obtained by obtaining good crystal conformation.

Other than the Co—Fe—B alloy, for example, an Fe—Co alloy may be used as the first magnetization reference layer 209.

A higher MR ratio is obtained as the thickness of the first magnetization reference layer 209 increases. For example, a larger fixed magnetic field is obtained as the thickness of the first magnetization reference layer 209 decreases. A trade-off relationship between the MR ratio and the fixed magnetic field exists for the thickness of the first magnetization reference layer 209. In the case where the Co—Fe—B alloy is used as the first magnetization reference layer 209, it is favorable for the thickness of the first magnetization reference layer 209 to be not less than 1.5 nm and not more than 5 nm. It is more favorable for the thickness of the first magnetization reference layer 209 to be not less than 2.0 nm and not more than 4 nm.

Other than the materials described above, the first magnetization reference layer 209 may include a $Co_{90}Fe_{10}$ alloy having a fcc structure, Co having a hcp structure, or a Co alloy having a hcp structure. For example, at least one selected from the group consisting of Co, Fe, and Ni is used as the first magnetization reference layer 209. An alloy that includes at least one material selected from these materials is used as the first magnetization reference layer 209. For example, a higher MR ratio is obtained by using an FeCo alloy material having a bcc structure, a Co alloy having a cobalt composition of 50% or more, or a material (a Ni alloy) having a Ni composition of 50% or more as the first magnetization reference layer 209.

For example, a Heusler magnetic alloy layer such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, $Co_2FeGa_{0.5}Ge_{0.5}$, etc., also may be used as the first magnetization reference layer 209. For example, a $Co_{40}Fe_{40}B_{20}$ layer having a thickness of 3 nm may be used as the first magnetization reference layer 209.

For example, the intermediate layer 203 breaks the magnetic coupling between the first magnetization reference layer 209 and the free magnetic layer 210.

For example, the material of the intermediate layer 203 includes a metal, an insulator, or a semiconductor. For example, Cu, Au, Ag, or the like is used as the metal. In the case where a metal is used as the intermediate layer 203, the thickness of the intermediate layer is, for example, not less than about 1 nm and not more than about 7 nm. For example, magnesium oxide (MgO, etc.), aluminum oxide ($Al_2O_3$, etc.), titanium oxide (TiO, etc.), zinc oxide (ZnO, etc.), gallium oxide (Ga—O), or the like is used as the insulator or the semiconductor. In the case where the insulator or the semiconductor is used as the intermediate layer 203, the thickness of the intermediate layer 203 is, for example, not less than about 0.6 nm and not more than about 2.5 nm. For example, a CCP (Current-Confined-Path) spacer layer may be used as the intermediate layer 203. In the case where a CCP spacer layer is used as the spacer layer, for example, a structure is used in which a copper (Cu) metal path is formed inside an insulating layer of aluminum oxide ($Al_2O_3$). For example, a MgO layer having a thickness of 1.6 nm is used as the intermediate layer.

The free magnetic layer 210 includes a ferromagnet material. For example, the free magnetic layer 210 includes a ferromagnet material including Fe, Co, and Ni. For example, an FeCo alloy, a NiFe alloy, or the like is used as the material of the free magnetic layer 210. The free magnetic layer 210 may include a Co—Fe—B alloy, an Fe—Co—Si—B alloy, an Fe—Ga alloy having a large λs (magnetostriction constant), an Fe—Co—Ga alloy, a Tb-M-Fe alloy, a Tb-M1-Fe-M2 alloy, an Fe-M3-M4-B alloy, Ni, Fe—Al, ferrite, etc. For example, the λs (the magnetostriction constant) is large for these materials. In the Tb-M-Fe alloy recited above, M is at least one selected from the group consisting of Sm, Eu, Gd, Dy, Ho, and Er. In the Tb-M1-Fe-M2 alloy recited above, M1 is at least one selected from the group consisting of Sm, Eu, Gd, Dy, Ho, and Er. M2 is at least one selected from the group consisting of Ti, Cr, Mn, Co, Cu, Nb, Mo, W, and Ta. In the Fe-M3-M4-B alloy recited above, M3 is at least one selected from the group consisting of Ti, Cr, Mn, Co, Cu, Nb, Mo, W, and Ta. M4 is at least one selected from the group consisting of Ce, Pr, Nd, Sm, Tb, Dy, and Er. $Fe_3O_4$, $(FeCo)_3O_4$, etc., are examples of the ferrite recited above. The thickness of the free magnetic layer 210 is, for example, 2 nm or more.

The free magnetic layer 210 may include a magnetic material including boron. The free magnetic layer 210 may include, for example, an alloy including boron (B) and at least one element selected from the group consisting of Fe, Co, and Ni. The free magnetic layer 210 includes, for example, a Co—Fe—B alloy or an Fe—B alloy. For example, a $Co_{40}Fe_{40}B_{20}$ alloy is used. Ga, Al, Si, W, etc., may be added in the case where the free magnetic layer 210 includes an alloy including boron (B) and at least one element selected from the group consisting of Fe, Co, and Ni. For example, high magnetostriction is promoted by adding these elements. For example, an Fe—Ga—B alloy, an Fe—Co—Ga—B alloy, or an Fe—Co—Si—B alloy may be used as the free magnetic layer 210. By using such a magnetic material containing boron, the coercivity (Hc) of the free magnetic layer 210 is low; and the change of the magnetization direction for the strain is easy. Thereby, high sensitivity is obtained.

It is favorable for the boron concentration (e.g., the composition ratio of boron) of the free magnetic layer 210 to be 5 at. % (atomic percent) or more. Thereby, an amorphous structure is easier to obtain. It is favorable for the boron concentration of the free magnetic layer to be 35 at. % or less. For example, the magnetostriction constant decreases when the boron concentration is too high. For example, it is favorable for the boron concentration of the free magnetic layer to be not less than 5 at. % and not more than 35 at. %; and it is more favorable to be not less than 10 at. % and not more than 30 at. %.

In the case where a portion of the magnetic layer of the free magnetic layer 210 includes $Fe_{1-y}B_y$ ($0<y\leq0.3$) or $(Fe_zX_{1-z})_{1-y}B_y$ (X being Co or Ni, $0.8\leq z<1$, and $0<y\leq0.3$), it is easy to realize both a large magnetostriction constant $\lambda$ and a low coercivity. Therefore, this is particularly favorable from the perspective of obtaining a high gauge factor. For example, $Fe_{80}B_{20}$ (4 nm) is used as the free magnetic layer 210. $Co_{40}Fe_{40}B_{20}$ (0.5 nm)/$Fe_{80}B_{20}$ (4 nm) may be used as the free magnetic layer.

The free magnetic layer 210 may have a multilayered structure. In the case where a tunneling insulating layer of MgO is used as the intermediate layer 203, it is favorable to provide a layer of a Co—Fe—B alloy at the portion of the free magnetic layer 210 contacting the intermediate layer 203. Thereby, a high magnetoresistance effect is obtained. In such a case, a layer of a Co—Fe—B alloy is provided on the intermediate layer 203; and another magnetic material that has a large magnetostriction constant is provided on the layer of the Co—Fe—B alloy. In the case where the free magnetic layer 210 has the multilayered structure, for example, the free magnetic layer 210 may include Co—Fe—B (2 nm)/Fe—Co—Si—B (4 nm), etc.

The capping layer 211 protects the layers provided under the capping layer 211. The capping layer 211 includes, for example, multiple metal layers. The capping layer 211 includes, for example, a two-layer structure (Ta/Ru) of a Ta layer and a Ru layer. The thickness of the Ta layer is, for example, 1 nm; and the thickness of the Ru layer is, for example, 5 nm. As the capping layer 211, another metal layer may be provided instead of the Ta layer and/or the Ru layer. The configuration of the capping layer 211 is arbitrary. For example, a nonmagnetic material is used as the capping layer 211. Another material may be used as the capping layer 211 as long as the material can protect the layers provided under the capping layer 211.

In the case where the free magnetic layer 210 includes a magnetic material containing boron, a diffusion suppression layer (not illustrated) of an oxide material and/or a nitride material may be provided between the free magnetic layer 210 and the capping layer 211. Thereby, for example, the diffusion of boron is suppressed. By using the diffusion suppression layer including an oxide layer or a nitride layer, the diffusion of the boron included in the free magnetic layer 210 can be suppressed; and the amorphous structure of the free magnetic layer 210 can be maintained. As the oxide material and/or the nitride material included in the diffusion suppression layer, for example, an oxide material or a nitride material including an element such as Mg, Al, Si, Ti, V, Cr, Mn, Fe, Co, Ni, Cu, Zn, Zr, Nb, Mo, Ru, Rh, Pd, Ag, Hf, Ta, W, Sn, Cd, Ga, or the like is used. The diffusion suppression layer is a layer that does not contribute to the magnetoresistance effect. It is favorable for the resistance per area of the diffusion suppression layer to be low. For example, it is favorable for the resistance per area of the diffusion suppression layer to be set to be lower than the resistance per area of the intermediate layer that contributes to the magnetoresistance effect. From the perspective of reducing the resistance per area of the diffusion suppression layer, it is favorable for the diffusion suppression layer to be an oxide or a nitride of Mg, Ti, V, Zn, Sn, Cd, and Ga. The barrier height is low for these materials. It is favorable to use an oxide having a strong chemical bond to suppress the diffusion of the boron. For example, a MgO layer of 1.5 nm is used. Oxynitrides are included in one of the oxide or the nitride.

In the case where the diffusion suppression layer includes an oxide or a nitride, it is favorable for the thickness of the diffusion suppression layer to be, for example, 0.5 nm or more. Thereby, the diffusion suppression function of the boron is realized sufficiently. It is favorable for the thickness of the diffusion suppression layer to be 5 nm or less. Thereby, for example, a low resistance per area is obtained. It is favorable for the thickness of the diffusion suppression layer to be not less than 0.5 nm and not more than 5 nm; and it is favorable to be not less than 1 nm and not more than 3 nm.

At least one selected from the group consisting of magnesium (Mg), silicon (Si), and aluminum (Al) may be used as the diffusion suppression layer. A material that includes these light elements may be used as the diffusion suppression layer. These light elements produce compounds by bonding with boron. For example, at least one of a Mg—B compound, an Al—B compound, or a Si—B compound is formed at the portion including the interface between the diffusion suppression layer and the free magnetic layer 210. These compounds suppress the diffusion of boron.

Another metal layer, etc., may be inserted between the diffusion suppression layer and the free magnetic layer 210. In the case where the distance between the diffusion suppression layer and the free magnetic layer 210 is too long, boron diffuses between the diffusion suppression layer and the free magnetic layer 210; and the boron concentration in the free magnetic layer 210 undesirably decreases. Therefore, it is favorable for the distance between the diffusion suppression layer and the free magnetic layer 210 to be 10 nm or less; and it is more favorable to be 3 nm or less.

Figure 9:
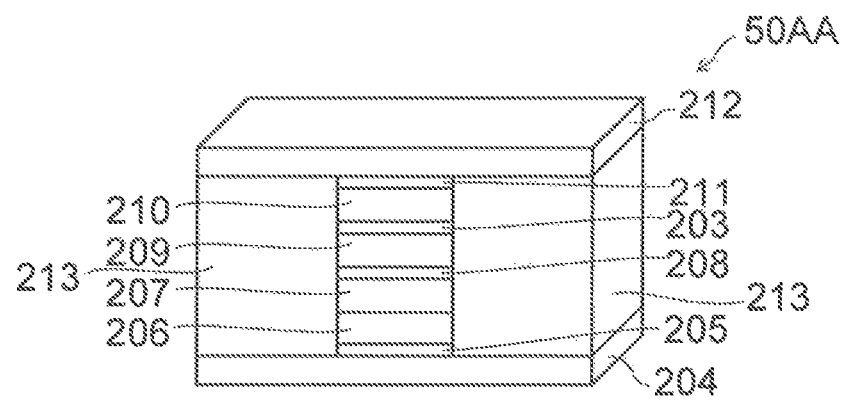
FIG. 9 is a schematic perspective view illustrating a portion of another sensor according to the embodiment.

FIG. 9 is a schematic perspective view illustrating a portion of another sensor according to the embodiment.

As shown in FIG. 9, other than an insulating layer 213 being provided, the sensor portion 50AA is similar to the sensor portion 50A. The insulating layer 213 is provided between the lower electrode 204 and the upper electrode 212. The insulating layer 213 is arranged with the free magnetic layer 210 and the first magnetization reference layer 209 in a direction crossing the direction connecting the lower electrode 204 and the upper electrode 212. Portions other than the insulating layer 213 are similar to those of the sensor portion 50A; and a description is therefore omitted.

The insulating layer 213 includes, for example, aluminum oxide (e.g., $Al_2O_3$), silicon oxide (e.g., $SiO_2$), etc. The leakage current of the sensor portion 50AA is suppressed by the insulating layer 213. The insulating layer 213 may be provided in the sensor portions described below.

Figure 10:
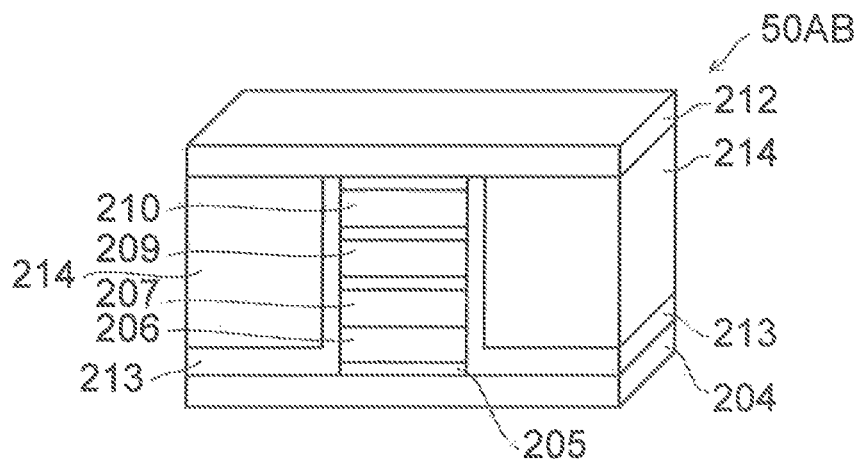
FIG. 10 is a schematic perspective view illustrating a portion of another sensor according to the embodiment.

FIG. 10 is a schematic perspective view illustrating a portion of another sensor according to the embodiment.

As shown in FIG. 10, a hard bias layer 214 is further provided in the sensor portion 50AB. Otherwise, the sensor portion 50AB is similar to the sensor portion 50A. The hard bias layer 214 is provided between the lower electrode 204 and the upper electrode 212. The free magnetic layer 210 and the first magnetization reference layer 209 are provided between two portions of the hard bias layer 214 in a direction crossing the direction connecting between the lower electrode 204 and the upper electrode 212. Otherwise, the sensor portion 50AB is similar to the sensor portion 50AA.

The hard bias layer 214 sets the magnetization direction of the free magnetic layer 210 by the magnetization of the hard bias layer 214. The magnetization direction of the free magnetic layer 210 is set to the desired direction by the hard bias layer 214 in a state in which pressure from the outside is not applied to the film.

The hard bias layer 214 includes, for example, Co—Pt, Fe—Pt, Co—Pd, Fe—Pd, etc. For example, the magnetic anisotropy and the coercivity are relatively high for these materials. These materials are, for example, hard magnetic materials. The hard bias layer 214 may include, for example, an alloy in which an added element is further added to Co—Pt, Fe—Pt, Co—Pd, or Fe—Pd. The hard bias layer 214 may include, for example, CoPt (the proportion of Co being not less than 50 at. % and not more than 85 at. %), $(Co_xPt_{100-x})_{100-y}Cr_y$ (x being not less than 50 at. % and not more than 85 at. %, and y being not less than 0 at. % and not more than 40 at. %), FePt (the proportion of Pt being not less than 40 at. % and not more than 60 at. %), etc. In the case where such a material is used, by applying an external magnetic field that is larger than the coercivity of the hard bias layer 214, the direction of the magnetization of the hard bias layer 214 is set (fixed) in the direction in which the external magnetic field is applied. The thickness (e.g., the length along the direction from the lower electrode 204 toward the upper electrode) of the hard bias layer 214 is, for example, not less than 5 nm and not more than 50 nm.

In the case where the insulating layer 213 is provided between the lower electrode 204 and the upper electrode 212, $SiO_x$ or $AlO_x$ is used as the material of the insulating layer 213. A not-Illustrated foundation layer may be further provided between the insulating layer 213 and the hard bias layer 214. Cr, Fe—Co, or the like is used as the material of the foundation layer for the hard bias layer 214 in the case where the hard bias layer 214 includes a hard magnetic material such as Co—Pt, Fe—Pt, Co—Pd, Fe—Pd, etc.

The hard bias layer 214 may have a structure of being stacked with a not-illustrated pinning layer for the hard bias layer. In such a case, the direction of the magnetization of the hard bias layer 214 can be set (fixed) by the exchange coupling of the hard bias layer 214 and the pinning layer for the hard bias layer. In such a case, the hard bias layer 214 includes a ferromagnetic material of at least one of Fe, Co, or Ni, or an alloy including at least one type of these elements. In such a case, the hard bias layer 214 includes, for example, a $Co_xFe_{100-x}$ alloy (x being not less than 0 at. % and not more than 100 at. %), a $Ni_xFe_{100-x}$ alloy (x being not less than 0 at. % and not more than 100 at. %), or a material in which a nonmagnetic element is added to these alloys. A material that is similar to the first magnetization reference layer 209 recited above is used as the hard bias layer 214. The pinning layer for the hard bias layer includes a material similar to the pinning layer 206 inside the sensor portion 50A recited above. In the case where the pinning layer for the hard bias layer is provided, a foundation layer similar to the material included in the foundation layer 205 may be provided under the pinning layer for the hard bias layer. The pinning layer for the hard bias layer may be provided at a lower portion or at an upper portion of the hard bias layer. In such a case, the magnetization direction of the hard bias layer 214 is determined by heat treatment in a magnetic field similarly to the pinning layer 206.

The hard bias layer 214 and the insulating layer 213 recited above are applicable to any sensor portion according to the embodiment. By using the stacked structure of the hard bias layer 214 and the pinning layer for the hard bias layer, the orientation of the magnetization of the hard bias layer 214 can be maintained easily even when a large external magnetic field is applied to the hard bias layer 214 for a short period of time.

Figure 11:
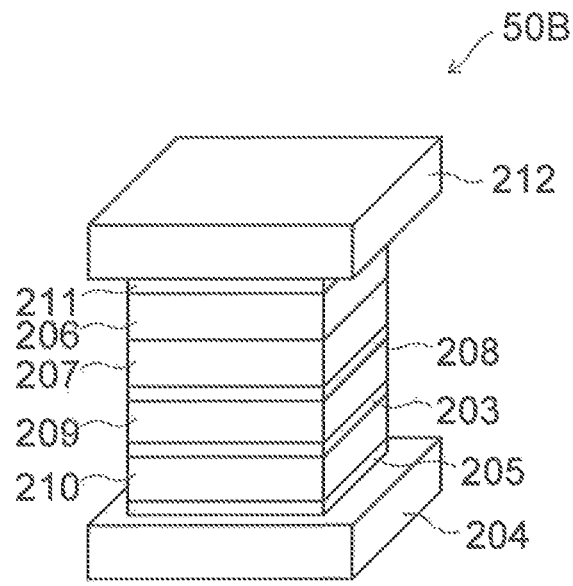
FIG. 11 is a schematic perspective view illustrating a portion of another sensor according to the embodiment.

FIG. 11 is a schematic perspective view illustrating a portion of another sensor according to the embodiment.

In the sensor portion 50B as shown in FIG. 11, the lower electrode 204, the foundation layer 205, the free magnetic layer 210, the intermediate layer 203, the first magnetization reference layer 209, the magnetic coupling layer 208, the second magnetization reference layer 207, the pinning layer 206, the capping layer 211, and the upper electrode 212 are stacked in order. The sensor portion 50B is, for example, a top spin-valve type.

The foundation layer 205 includes, for example, a stacked film of tantalum and copper (Ta/Cu). The thickness (the length in the Z-axis direction) of the Ta layer is, for example, 3 nm. The thickness of the Cu layer is, for example, 5 nm. The free magnetic layer 210 includes, for example, $Co_{40}Fe_{40}B_{20}$ having a thickness of 4 nm. The intermediate layer 203 includes, for example, a MgO layer having a thickness of 1.6 nm. The first magnetization reference layer 209 includes, for example, $Co_{40}Fe_4B_{20}/Fe_{50}Co_{50}$. The thickness of the $Co_{40}Fe_{40}B_{20}$ layer is, for example, 2 nm. The thickness of the $Fe_{50}Co_{50}$ layer is, for example, 1 nm. The magnetic coupling layer 208 includes, for example, a Ru layer having a thickness of 0.9 nm. The second magnetization reference layer 207 includes, for example, a $Co_{75}Fe_{25}$ layer having a thickness of 2.5 nm. The pinning layer 206 includes, for example, an IrMn-layer having a thickness of 7 nm. The capping layer 211 includes, for example, Ta/Ru. The thickness of the Ta layer is, for example, 1 nm. The thickness of the Ru layer is, for example, 5 nm.

The materials of the layers included in the sensor portion 50B may be the vertically inverted materials of the layers included in the sensor portion 50A. The diffusion suppression layer recited above may be provided between the foundation layer 205 and the free magnetic layer 210 of the sensor portion 50B.

Figure 12:
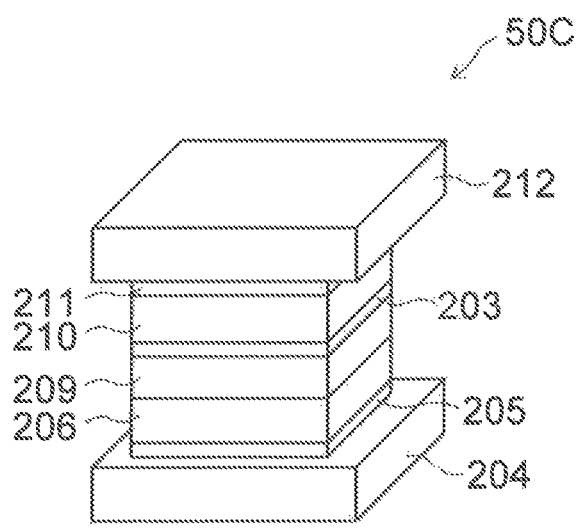
FIG. 12 is a schematic perspective view illustrating a portion of another sensor according to the embodiment.

FIG. 12 is a schematic perspective view illustrating a portion of another sensor according to the embodiment.

In the sensor portion 50C as shown in FIG. 12, the lower electrode 204, the foundation layer 205, the pinning layer 206, the first magnetization reference layer 209, the intermediate layer 203, the free magnetic layer 210, and the capping layer 211 are stacked in this order. For example, the sensor portion 50C has a single pinned structure that uses a single magnetization reference layer.

The foundation layer 205 includes, for example, Ta/Ru. The thickness (the length in the Z-axis direction) of the Ta layer is, for example, 3 nm. The thickness of the Ru layer is, for example, 2 nm. The pinning layer 206 includes, for example, an IrMn-layer having a thickness of 7 nm. The first magnetization reference layer 209 includes, for example, a $Co_{40}Fe_{40}B_{20}$ layer having a thickness of 3 nm. The intermediate layer 203 includes, for example, a MgO layer having a thickness of 1.6 nm. The free magnetic layer 210 includes, for example, $Co_{40}Fe_{40}B_{20}$ having a thickness of 4 nm. The capping layer 211 includes, for example, Ta/Ru. The thickness of the Ta layer is, for example, 1 nm. The thickness of the Ru layer is, for example, 5 nm.

For example, materials similar to the materials of the layers of the sensor portion 50A are used as the materials of the layers of the sensor portion 50C.

Figure 13:
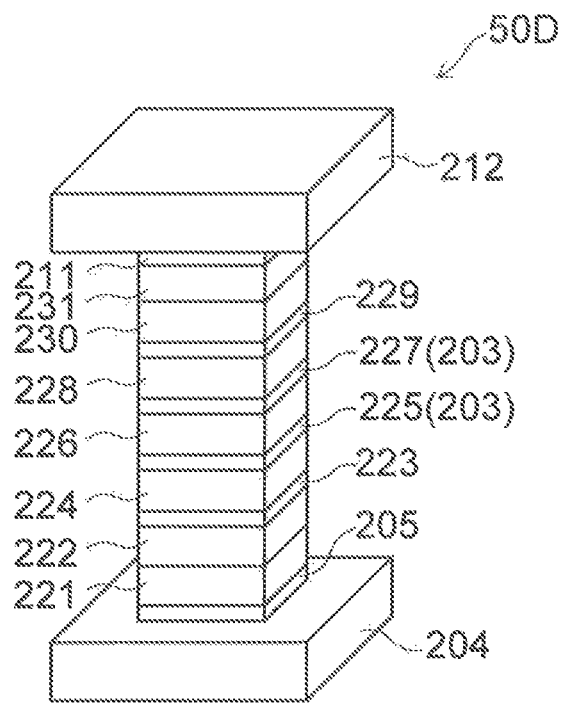
FIG. 13 is a schematic perspective view illustrating a portion of another sensor according to the embodiment.

FIG. 13 is a schematic perspective view illustrating a portion of another sensor according to the embodiment.

In the sensor portion 50D as shown in FIG. 13, the lower electrode 204, the foundation layer 205, a lower pinning layer 221, a lower second magnetization reference layer 222, a lower magnetic coupling layer 223, a lower first magnetization reference layer 224, a lower intermediate layer 225, a free magnetic layer 226, an upper intermediate layer 227, an upper first magnetization reference layer 228, an upper magnetic coupling layer 229, an upper second magnetization reference layer 230, an upper pinning layer 231, and the capping layer 211 are stacked in order.

The foundation layer 205 includes, for example, Ta/Ru. The thickness (the length in the Z-axis direction) of the Ta layer is, for example, 3 nanometers (nm). The thickness of the Ru layer is, for example, 2 nm. The lower pinning layer 221 includes, for example, an IrMn-layer having a thickness of 7 nm. The lower second magnetization reference layer 222 includes, for example, a $Co_{75}Fe_{25}$ layer having a thickness of 2.5 nm. The lower magnetic coupling layer 223 includes, for example, a Ru layer having a thickness of 0.9 nm. The lower first magnetization reference layer 224 includes, for example, a $Co_{40}Fe_{40}B_{20}$ layer having a thickness of 3 nm. The lower intermediate layer 225 includes, for example, a MgO layer having a thickness of 1.6 nm. The free magnetic layer 226 includes, for example, $Co_{40}Fe_{40}B_{20}$ having a thickness of 4 nm. The upper intermediate layer 227 includes, for example, a MgO layer having a thickness of 1.6 nm. The upper first magnetization reference layer 228 includes, for example, $Co_{40}Fe_{40}B_{20}/Fe_{50}Co_{50}$. The thickness of the $Co_{40}Fe_{40}B_{20}$ layer is, for example, 2 nm. The thickness of the $Fe_{50}Co_{50}$ layer is, for example, 1 nm. The upper magnetic coupling layer 229 includes, for example, a Ru layer having a thickness of 0.9 nm. The upper second magnetization reference layer 230 includes, for example, a $Co_{75}Fe_{25}$ layer having a thickness of 2.5 nm. The upper pinning layer 231 includes, for example, an IrMn-layer having a thickness of 7 nm. The capping layer 211 includes, for example, Ta/Ru. The thickness of the Ta layer is, for example, 1 nm. The thickness of the Ru layer is, for example, 5 nm.

For example, materials similar to the materials of the layers of the sensor portion 50A are used as the materials of the layers of the sensor portion 50D.

Figure 14:
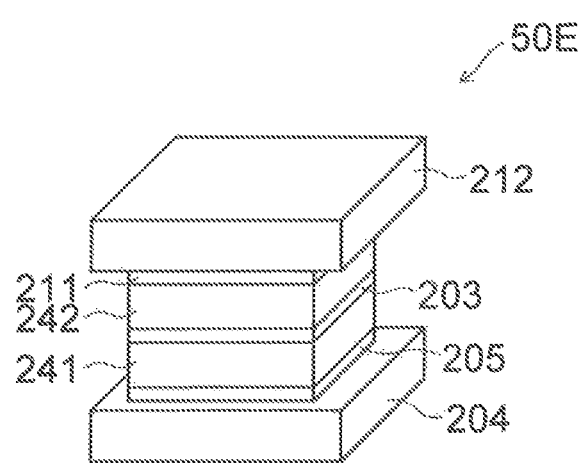
FIG. 14 is a schematic perspective view illustrating a portion of another sensor according to the embodiment.

FIG. 14 is a schematic perspective view illustrating a portion of another sensor according to the embodiment.

In the sensor portion 50E as shown in FIG. 14, the lower electrode 204, the foundation layer 205, a first free magnetic layer 241, the intermediate layer 203, a second free magnetic layer 242, the capping layer 211, and the upper electrode 212 are stacked in this order.

The foundation layer 205 includes, for example, Ta/Cu. The thickness (the length in the Z-axis direction) of the Ta layer is, for example, 3 nm. The thickness of the Cu layer is, for example, 5 nm. The first free magnetic layer 241 includes, for example, $Co_{40}Fe_{40}B_{20}$ having a thickness of 4 nm. The intermediate layer 203 includes, for example, $Co_{40}Fe_{40}B_{20}$ having a thickness of 4 nm. The capping layer 211 includes, for example, Cu/Ta/Ru. The thickness of the Cu layer is, for example, 5 nm. The thickness of the Ta layer is, for example, 1 nm. The thickness of the Ru layer is, for example, 5 nm.

Materials similar to the materials of the layers of the sensor portion 50A are used as the materials of the layers of the sensor portion 50E. For example, materials similar to those of the free magnetic layer 210 of the sensor portion 50A may be used as the materials of the first free magnetic layer 241 and the second free magnetic layer 242. The magnetostriction polarity of the first free magnetic layer 241 and the magnetostriction polarity of the second free magnetic layer 242 may be reversed.

The embodiments may include the following configurations (e.g., technological proposals).

(Configuration 1)
A sensor, comprising:
a first film;
a first sensor portion provided at the first film, the first sensor portion including
a first magnetic layer,
a second magnetic layer provided between the first film and the first magnetic layer, and
a first intermediate layer provided between the first magnetic layer and the second magnetic layer;
a driving portion configured to cause the first film to deform at a first frequency; and
a processor configured to output a third signal based on a first signal and a second signal, the first signal relating to the first frequency, the second signal being output from the first sensor portion.

(Configuration 2)
The sensor according to configuration 1, wherein the driving portion applies stress to the first film.

(Configuration 3)
The sensor according to configuration 2, wherein the driving portion emits a pressure wave of the first frequency toward the first film.

(Configuration 4)
The sensor according to configuration 2, further comprising a support portion supporting the first film,
the support portion being fixed to the driving portion,
the driving portion being configured to vibrate at the first frequency.

(Configuration 5)
The sensor according to any of configurations 1-4, wherein
the processor supplies the first signal to the driving portion, and
the driving portion causes the first film to deform based on the first signal.

(Configuration 6)
The sensor according to any of configurations 1-4, wherein the processor acquires the first signal from the driving portion.

(Configuration 7)
The sensor according to configuration 3, wherein the first film is provided between the driving portion and the first sensor portion.

(Configuration 8)
The sensor according to any of configurations 1-7, further comprising a first sensor conductive layer and a second sensor conductive layer,
the first sensor portion being provided between the first sensor conductive layer and the first film,
the second sensor conductive layer being provided between the first sensor portion and the first film.

(Configuration 9)
The sensor according to any of configurations 1-8, wherein the deforming of the first film includes a component in a first direction, the first direction being from the first magnetic layer toward the second magnetic layer.

(Configuration 10)
The sensor according to any of configurations 1-9, wherein
the second signal is a signal modulated by the deforming of the first film, and
the processor outputs the third signal by demodulating the second signal.

(Configuration 11)
A sensor, comprising:
a piezoelectric body layer;
a first sensor portion provided at the piezoelectric body layer, the first sensor portion including
a first magnetic layer, a second magnetic layer provided between the piezoelectric body layer and the first magnetic layer, and
a first intermediate layer provided between the first magnetic layer and the second magnetic layer; and
a processor configured to apply a voltage of a first frequency to the piezoelectric body layer and output a third signal, the third signal being based on a first signal and a second signal, the first signal relating to the first frequency, the second signal being output from the first sensor portion.

(Configuration 12)

The sensor according to configuration 11, further comprising a first element conductive layer and a second element conductive layer,
the first element conductive layer being provided between the second element conductive layer and the first sensor portion,
the piezoelectric body layer being provided between the first element conductive layer and the second element conductive layer.

(Configuration 13)

The sensor according to configuration 12, further comprising a support portion supporting a first element portion, the first element portion including the piezoelectric body layer, the first element conductive layer, and the second element conductive layer,
the first element portion including a first element region and a second element region,
the second element region being fixed to the support portion,
the first element region being connected to the second element region,
the first sensor portion being provided at the first element region.

(Configuration 14)

The sensor according to any of configurations 11-13, wherein
the second signal is a signal modulated by the deforming of the piezoelectric body, and
the processor outputs the third signal by demodulating the second signal.

(Configuration 15)

The sensor according to any of configurations 1-14, wherein
a magnetic field vibrating at a second frequency is applied to the first sensor portion, and
the third signal includes a component of the second frequency.

(Configuration 16)

The sensor according to configuration 15, wherein the second frequency is lower than the first frequency.

(Configuration 17)

The sensor according to any of configurations 15 and 16, wherein the second frequency is not less than 1 hertz and not more than 1000 hertz.

(Configuration 18)

The sensor according to any of configurations 1-17, wherein the first frequency is not less than 1 kilohertz and not more than 100 kilohertz.

"sensor" described above may be, for example, "sensor device". A configuration including "sensor device" and a processor may be considered as "sensor".

According to the embodiments, a sensor is provided in which the sensing precision is increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the sensor such as sensor portion, the magnetic layer, the conductive layer, the electrode, the film, the support portion, the driving portion, the element portion, the processor, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all sensors practicable by an appropriate design modification by one skilled in the art based on the sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
a first film;
a first sensor portion provided at the first film, the first sensor portion including
a first magnetic layer,
a second magnetic layer provided between the first film and the first magnetic layer, and
a first intermediate layer provided between the first magnetic layer and the second magnetic layer;
a driving portion configured to cause the first film to deform at a first frequency; and
a processor configured to output a third signal based on a first signal and a second signal, the first signal being supplied by the processor and relating to the first frequency, the second signal being output from the first sensor portion,
wherein
the second signal is a signal modulated by the deforming of the first film, and
the processor outputs the third signal by demodulating the second signal.

2. The sensor according to claim 1, wherein the driving portion applies stress to the first film.

3. The sensor according to claim 2, wherein the driving portion emits a pressure wave of the first frequency toward the first film.

4. The sensor according to claim 3, wherein the first film is provided between the driving portion and the first sensor portion.

5. The sensor according to claim 2, further comprising a support portion supporting the first film,
the support portion being fixed to the driving portion,
the driving portion being configured to vibrate at the first frequency.

6. The sensor according to claim 1, wherein
the processor supplies the first signal to the driving portion, and
the driving portion causes the first film to deform based on the first signal.

7. The sensor according to claim 1, wherein the processor acquires the first signal from the driving portion.

8. The sensor according to claim 1, further comprising a first sensor conductive layer and a second sensor conductive layer,
the first sensor portion being provided between the first sensor conductive layer and the first film,
the second sensor conductive layer being provided between the first sensor portion and the first film.

9. The sensor according to claim 1, wherein the deforming of the first film includes a component in a first direction, the first direction being from the first magnetic layer toward the second magnetic layer.

10. The sensor according to claim 1, wherein the first frequency is not less than 1 kilohertz and not more than 100 kilohertz.

11. The sensor according to claim 1, wherein the first sensor portion is fixed to the first film.

12. The sensor according to claim 1, second magnetic layer is fixed to the first film.

13. A sensor, comprising:
a first film;
a first sensor portion provided at the first film, the first sensor portion including
a first magnetic layer,
a second magnetic layer provided between the first film and the first magnetic layer, and
a first intermediate layer provided between the first magnetic layer and the second magnetic layer;
a driving portion configured to cause the first film to deform at a first frequency; and
a processor configured to output a third signal based on a first signal and a second signal, the first signal being supplied by the processor and relating to the first frequency, the second signal being output from the first sensor portion,
wherein
a magnetic field vibrating at a second frequency is applied to the first sensor portion, and
the third signal includes a component of the second frequency.

14. The sensor according to claim 13, wherein the second frequency is lower than the first frequency.

15. The sensor according to claim 13, wherein the second frequency is not less than 1 hertz and not more than 1000 hertz.

16. The sensor according to claim 13, wherein the first sensor portion is fixed to the first film.

17. The sensor according to claim 13, second magnetic layer is fixed to the first film.

* * * * *